(12) United States Patent
Ueno (10) Patent No.: US 8,390,417 B2
(45) Date of Patent: Mar. 5, 2013

(54) LAMINATED ELECTRONIC COMPONENT

(75) Inventor: Kenji Ueno, Fukui (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/062,009

(22) PCT Filed: Sep. 17, 2009

(86) PCT No.: PCT/JP2009/004669
§ 371 (c)(1),
(2), (4) Date: Mar. 3, 2011

(87) PCT Pub. No.: WO2010/032464
PCT Pub. Date: Mar. 25, 2010

(65) Prior Publication Data
US 2011/0163832 A1   Jul. 7, 2011

(30) Foreign Application Priority Data
Sep. 22, 2008 (JP) ................. 2008-242145

(51) Int. Cl.
*H01F 5/00* (2006.01)
*H01F 27/28* (2006.01)

(52) U.S. Cl. .................. 336/200; 336/223; 336/232

(58) Field of Classification Search .................. 336/200, 336/223, 232
See application file for complete search history.

(56) References Cited

U.S. PATENT DOCUMENTS

| | | | | |
|---|---|---|---|---|
| 5,959,522 A * | 9/1999 | Andrews | ....................... | 336/200 |
| 6,911,890 B2 * | 6/2005 | Satoh et al. | ................... | 336/200 |
| 7,382,219 B1 * | 6/2008 | Lee | ............................. | 336/84 C |
| 8,058,964 B2 * | 11/2011 | Sato | .............................. | 336/232 |
| 8,089,331 B2 * | 1/2012 | Jacobson et al. | ............. | 336/84 C |
| 2005/0068146 A1 * | 3/2005 | Jessie | ............................ | 336/200 |
| 2006/0238273 A1 | 10/2006 | Tomonari et al. | | |
| 2007/0182519 A1 * | 8/2007 | Tsuzuki et al. | ............... | 336/200 |

FOREIGN PATENT DOCUMENTS

| | | |
|---|---|---|
| CN | 1841579 A | 10/2006 |
| JP | 09-181551 A | 7/1997 |
| JP | 11-273954 A | 10/1999 |
| JP | 2005-260343 A | 9/2005 |
| JP | 2006-041632 A | 2/2006 |

OTHER PUBLICATIONS

International Search Report for PCT/JP2009/004669 dated Dec. 28, 2009.
Machine Translation of JP 2005-260343 A, previously filed in IDS dated Mar. 3, 2011.

\* cited by examiner

*Primary Examiner* — Mohamad Musleh
*Assistant Examiner* — Ronald Hinson
(74) *Attorney, Agent, or Firm* — Pearne & Gordon LLP (57) ABSTRACT

The invention presents a laminated electronic component configured to include: first coil pattern formed on a plurality of insulating layers, and second coil pattern disposed to face first coil pattern through at least one insulating layer. Both ends of first coil pattern are coupled with external electrodes; both ends of second coil pattern are not coupled with the external electrodes.

7 Claims, 8 Drawing Sheets

LAMINATED ELECTRONIC COMPONENT

This Application is a U.S. National Phase Application of PCT International Application PCT/JP2009/004669.

TECHNICAL FIELD

The present invention relates to a laminated electronic component for use in a wide range of electronic equipment including digital devices, audiovisual devices, and information-communication terminal devices.

BACKGROUND ART

Figure 13:
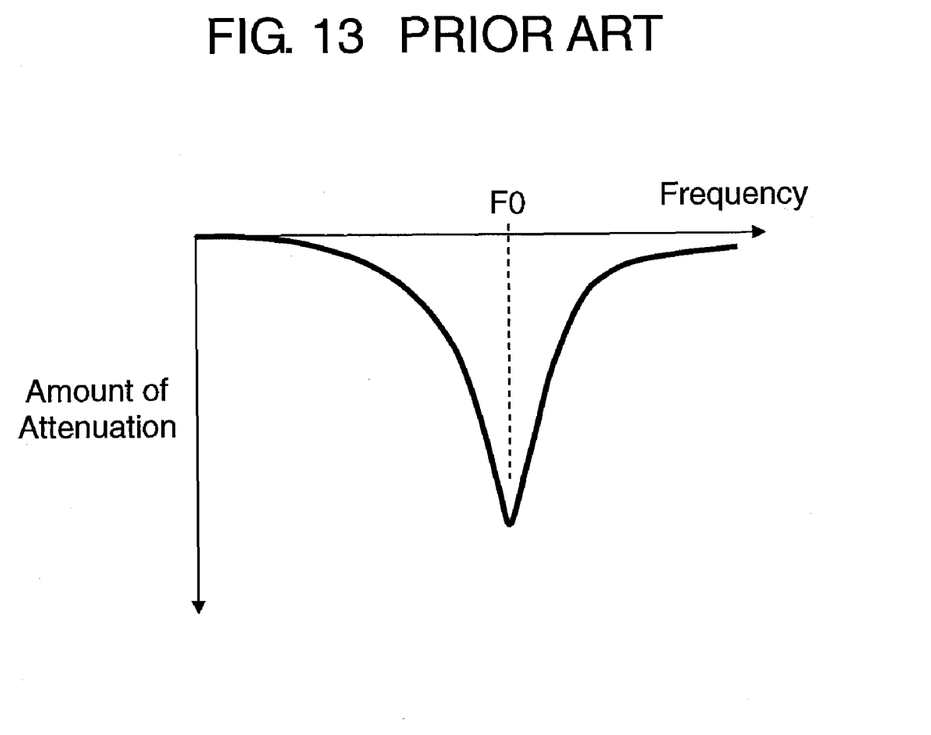
FIG. 13 is a characteristic graph showing a relationship between frequency and an amount of attenuation for a conventional laminated electronic component.

FIG. 13 is a characteristic graph showing a relationship between frequency and an amount of attenuation for a conventional laminated electronic component. Conventional laminated electronic components of this kind have a structure in which coils are formed in insulators such as a magnetic material. And, a resonance is generated at a specific frequency F0 shown in FIG. 13 by inductance components of the coils and floating capacitance between the coils. This generates an attenuation pole at the frequency (F0), thereby allowing noise rejection at the specific frequency.

Figure 14:
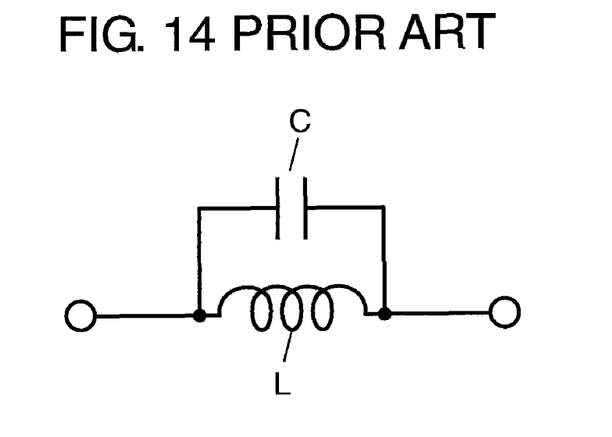
FIG. 14 is an equivalent circuit schematic of the conventional laminated electronic component.

FIG. 14 is an equivalent circuit schematic of a conventional laminated electronic component. In FIG. 14, capacitance C is connected in parallel to coil L. And, an attenuation pole similar to that of FIG. 13 is generated by the capacitance C and an inductance component of the coil L, allowing noise rejection at a specific frequency.

Note that Patent Literature 1 is known as a conventional art document relating to the present invention, for example.

However, in conventional laminated electronic components described above, noise in a broad frequency band or at a plurality of frequencies has been difficult to reject because such an attenuation pole is generated only at a specific frequency.

CITATION LIST

Patent Literature

Patent Literature 1: Japanese Patent Unexamined Publication No. H11-273954

SUMMARY OF THE INVENTION

The present invention presents a laminated electronic component capable of rejecting noise in a broad frequency band or at a plurality of frequencies.

The laminated electronic component according to the present invention is configured to include a first coil pattern formed on a plurality of insulating layers, and a second coil pattern disposed to face the first coil pattern through at least one insulating layer. And, both ends of the first coil pattern are coupled with external electrodes; both ends of the second coil pattern are not coupled with the external electrodes.

With such a configuration, a resonance is generated at a specific frequency by a floating capacitance component of the first coil pattern and an inductance component of the first coil pattern. In addition, another resonance is also generated at another specific frequency by: an inductance component of the second coil pattern that is magnetically coupled with the first coil pattern, and mutual inductance occurring between the first and second coil patterns; and a floating capacitance component occurring between the first and second coil patterns. Consequently, two attenuation poles are generated, which thereby allows noise rejection in a broad frequency band or at two frequencies.

DETAILED DESCRIPTION OF PREFERRED EMBODIMENTS

First Embodiment

Figure 1:
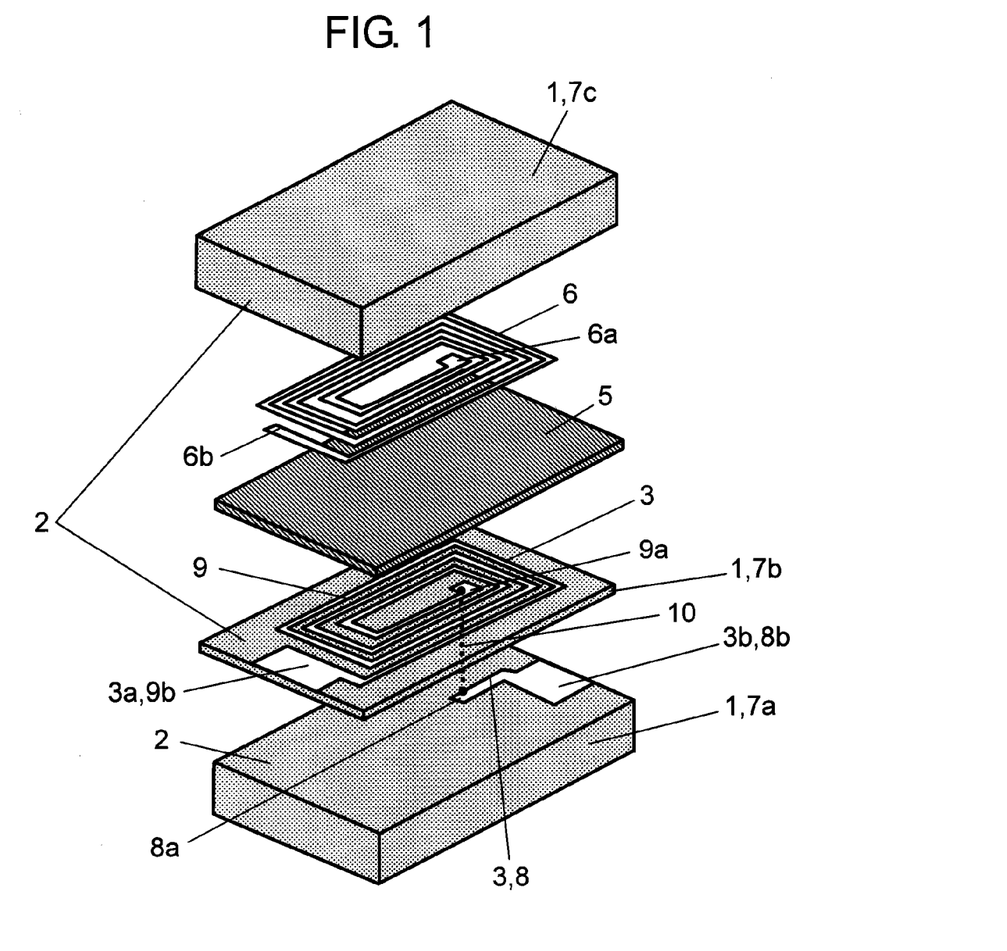
FIG. 1 is an exploded perspective view of a laminated electronic component according to a first embodiment of the present invention.
Figure 2:
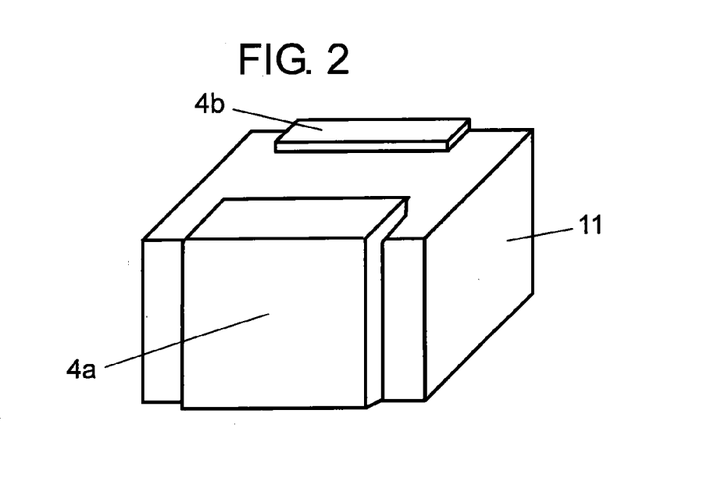
FIG. 2 is a perspective view of the laminated electronic component according to the first embodiment of the invention.

FIG. 1 is an exploded perspective view of a laminated electronic component according to a first embodiment of the present invention. FIG. 2 is a perspective view of the laminated electronic component according to the first embodiment of the invention. In FIGS. 1 and 2, the laminated electronic component according to the present invention is configured to include insulator 2 composed of a plurality of first insulating layers 1, first coil pattern 3 formed on insulator 2, second insulating layer 5 formed on the upper surface of first coil pattern 3, and second coil pattern 6 disposed to face first coil pattern 3 through second insulating layer 5. And, both ends 3a and 3b of first coil pattern 3 are respectively coupled with external electrodes 4a and 4b; both ends 6a and 6b of second coil pattern 6 are not coupled with the external electrodes.

In the above configuration, first insulating layer 1 has insulation properties and includes first to third magnetic material layers 7a to 7c that are formed of magnetic materials such as a Ni—Zn ferrite. And, insulator 2 is formed by laminating first to third magnetic material layers 7a to 7c in this order from the bottom.

First coil pattern 3 includes leading conductor 8 formed on the upper surface of first magnetic material layer 7a, and spirally-coiled conductor 9 formed on the upper surface of second magnetic material layer 7b. One end 8a of leading conductor 8 is coupled with one end 9a of coiled conductor 9 through via hole 10 formed in second magnetic material layer 7b. Note that via hole 10 is formed by filling a conductive material such as silver in a hole penetrating second magnetic material layer 7b.

The other end 8b of leading conductor 8 and the other end 9b of coiled conductor 9, i.e., both ends 3a and 3b of first coil pattern 3, are exposed to the outsides of first magnetic material layer 7a and second magnetic material layer 7b, and are coupled with external electrodes 4a and 4b, respectively. Note that first coil pattern 3 is formed by plating with a conductive material such as silver.

External electrodes 4a and 4b are formed by printing silver on both ends of the laminated electronic component. On the surfaces of external electrodes 4a and 4b, a nickel plating layer and a tin plating layer are respectively formed.

Second insulating layer 5 having insulation properties is formed in a sheet-like structure on the upper surface of coiled conductor 9, and composed of a nonmagnetic material such as a Cu—Zn ferrite or a glass ceramic.

Second coil pattern 6 is formed in a spiral shape by plating with a conductive material such as silver on the upper surface of second insulating layer 5, and disposed to face first coil pattern 3 through one insulating layer 5. And, both ends 6a and 6b of second coil pattern 6 are configured to avoid exposure to the outside so as not to be coupled with the external electrodes. Note that, on the upper surface of second coil pattern 6, third magnetic material layer 7c is formed.

With such a configuration, portions, facing one another, of first coil pattern 3 and second coil pattern 6, i.e., coiled conductor 9 and second coil pattern 6, are allocated so as to be superposed on one another as viewed from above. Coiled conductor 9 and second coil pattern 6 are each of a spiral shape, which thereby allows a larger magnetic coupling between first coil pattern 3 and second coil pattern 6, resulting in larger mutual inductance M.

Note that, although second insulating layer 5 and first to third magnetic material layers 7a to 7c are each a single layer in FIG. 1, these layers may be each a plurality of layers.

With this configuration, body 11 of the laminated electronic component is completed. At both ends of body 11, a pair of external electrodes 4a and 4b are formed so as to be coupled with both ends 3a and 3b of first coil pattern 3, respectively.

Next, a manufacturing method for the laminated electronic component according to the first embodiment of the present invention will be described.

First, in FIGS. 1 and 2, insulating layer 5 and first to third magnetic material layers 7a to 7c are each fabricated in a predetermined number of rectangular pieces with a mixture of a resin and a powder; the powder is of either magnetic or nonmagnetic materials, as a raw material of insulating layers 1 and 5, respectively. In this process, a hole is made through second magnetic material layer 7b at a predetermined location by means of laser or punching, and then filled with silver to form via hole 10.

Next, leading conductor 8 is formed by plating on the upper surface of first magnetic material layer 7a. After that, second magnetic material layer 7b having via hole 10 is laminated on the upper surface of leading conductor 8. In this process, one end 8a of leading conductor 8 is coupled with via hole 10.

Next, spirally-coiled conductor 9 is formed by plating on the upper surface of second magnetic material layer 7b. In this process, one end 9a of coiled conductor 9 is coupled with via hole 10 to configure first coil pattern 3.

Next, second insulating layer 5 is laminated on the upper surface of coiled conductor 9. After that, second coil pattern 6 is formed in a spiral shape on the upper surface of second insulating layer 5. In this process, second coil pattern 6 and coiled conductor 9 are allocated so as to be superposed on one another as viewed from above.

Note that a method for forming first coil pattern 3 (leading conductor 8 and coiled conductor 9) and second coil pattern 6 is such that conductors of predetermined patterns are formed by plating on base plates (not shown) separately prepared, and then these conductors are respectively transferred to the layers. Note also that first coil pattern 3 and second coil pattern 6 may be formed by another method including printing and evaporation, instead of plating.

Next, third magnetic material layer 7c is laminated on the upper surface of second coil pattern 6 to form body 11 of the laminated electronic component.

Next, body 11 is fired at a predetermined temperature for a predetermined period of time. Then, silver is printed on the both ends of body 11 so as to be respectively coupled with both ends 3a and 3b of first coil pattern 3, thereby forming a pair of external electrodes 4a and 4b.

Finally, a nickel plating layer and a tin plating layer are respectively formed by plating on the surfaces of the pair of external electrodes 4a and 4b.

As described above, in the first embodiment of the invention, both ends 6a and 6b of second coil pattern 6 disposed to face first coil pattern 3 through second insulating layer 5, are configured so as not to be coupled with external electrodes. Consequently, this configuration allows noise rejection in a broad frequency band or at two frequencies.

Figure 3:
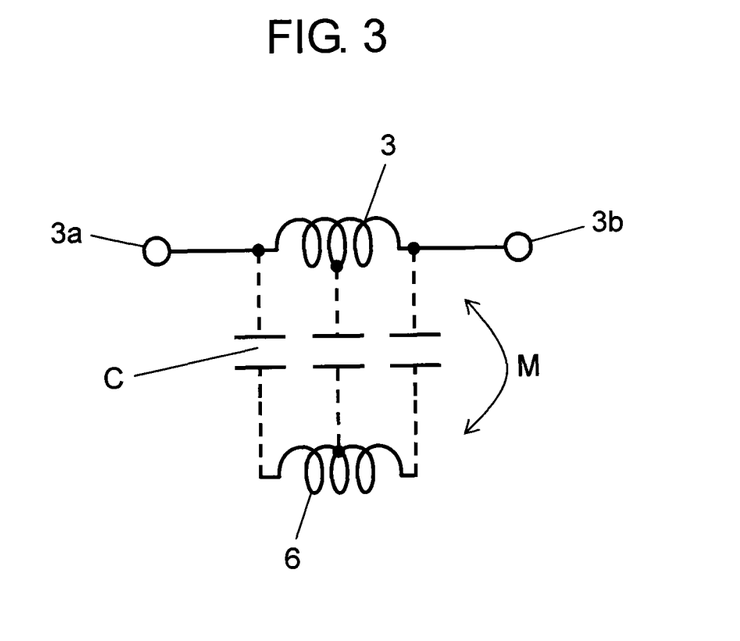
FIG. 3 is an equivalent circuit schematic of the laminated electronic component according to the first embodiment of the invention.
Figure 4:
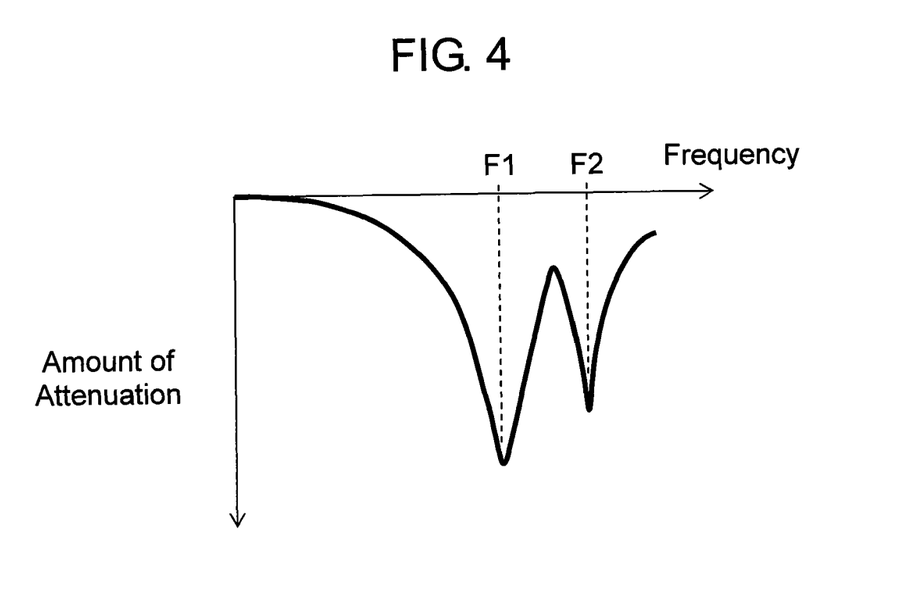
FIG. 4 is a characteristic graph showing a relationship between frequency and an amount of attenuation for the laminated electronic component according to the first embodiment of the invention.

FIG. 3 is an equivalent circuit schematic of the laminated electronic component according to the first embodiment of the invention. FIG. 4 is a characteristic graph showing a relationship between frequency and an amount of attenuation for the laminated electronic component according to the first embodiment of the invention. In FIGS. 3 and 4, floating capacitance C occurs in parallel with first coil pattern 3. And, a resonance is generated at a specific frequency (F1) by the floating capacitance component and an inductance component of first coil pattern 3. In addition, another resonance is generated at another specific frequency (F2) by: an inductance component of the second coil pattern 6 itself which is magnetically coupled with the first coil pattern 3, and mutual inductance occurring between the first and second coil patterns 3 and 6; and floating capacitance components occurring between the first and second coil patterns 3 and 6. These resonances generate attenuation poles at two frequencies (F1 and F2) as shown in FIG. 4.

Moreover, since both ends 6a and 6b of second coil pattern 6 are configured so as not to be coupled with external electrodes, there is no need for forming any corresponding external electrodes. With this configuration, it is possible to increase productivity and reduce a mounting area where the laminated electronic component is mounted.

It should be noted that, in the aforementioned first embodiment of the invention, although first insulating layer 1 and second insulating layer 5 are respectively configured of a magnetic and a nonmagnetic material, this configuration is not always necessary. Moreover, if at least one of first insulating layer 1 and second insulating layer 5 is configured of either a magnetic material or a dielectric material, it makes possible to increase the inductance components or the floating capacitance components, allowing the rejection of a larger amount of noise.

Second Embodiment

Figure 5:
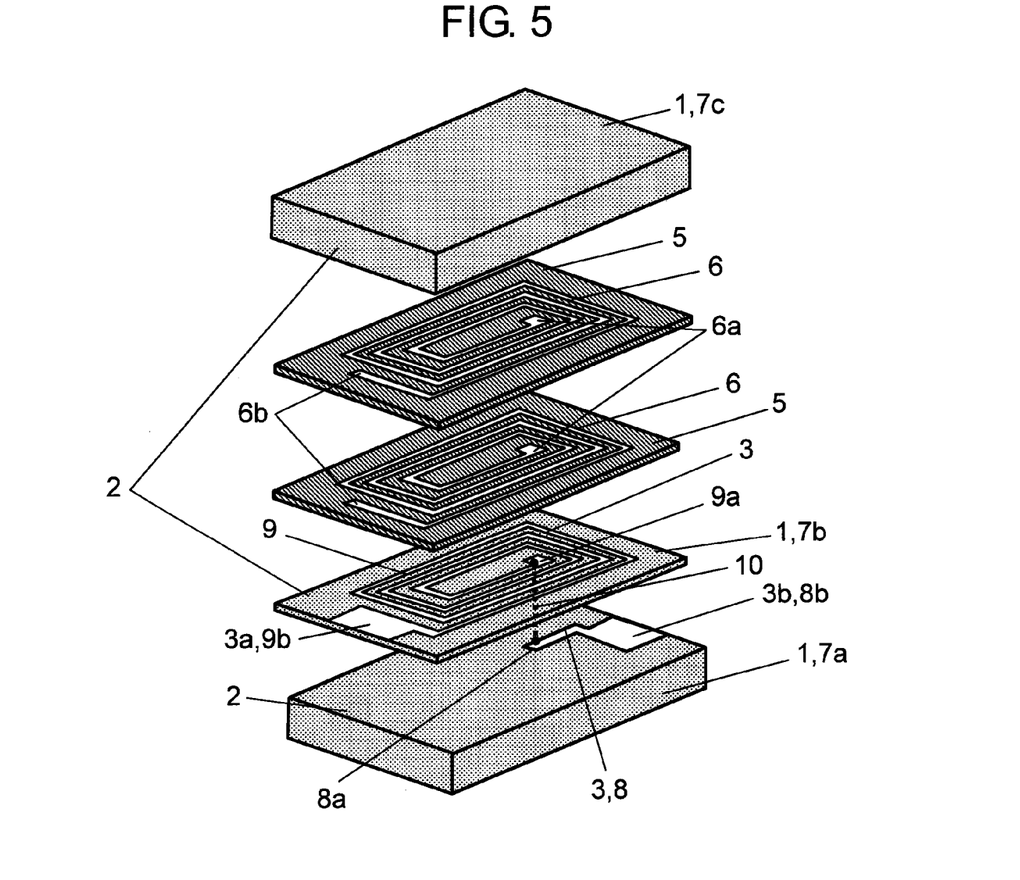
FIG. 5 is an exploded perspective view of a laminated electronic component according to a second embodiment of the invention.
Figure 6:
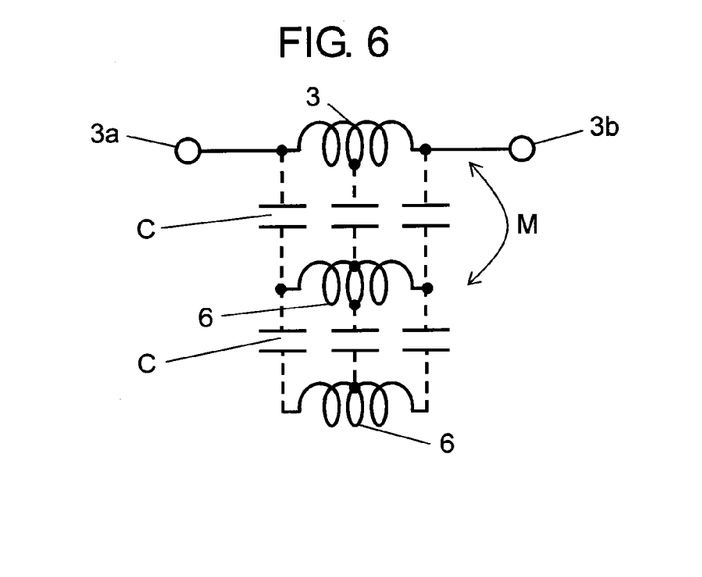
FIG. 6 is an equivalent circuit schematic of the laminated electronic component according to the second embodiment of the invention.

FIG. 5 is an exploded perspective view of a laminated electronic component according to a second embodiment of the invention. FIG. 6 is an equivalent circuit schematic of the laminated electronic component according to the second embodiment of the invention. Note that, in the second embodiment of the invention, parts having similar configurations to those of the aforementioned first embodiment of the invention are designated with the same reference numerals, and their explanations are omitted.

In FIGS. 5 and 6, a difference of the second embodiment of the invention from the aforementioned first embodiment of the invention is in that two of second coil pattern 6 are disposed. The second coil patterns 6 are both of a spiral shape and located above first coil pattern 3 through second insulating layer 5.

Figure 7:
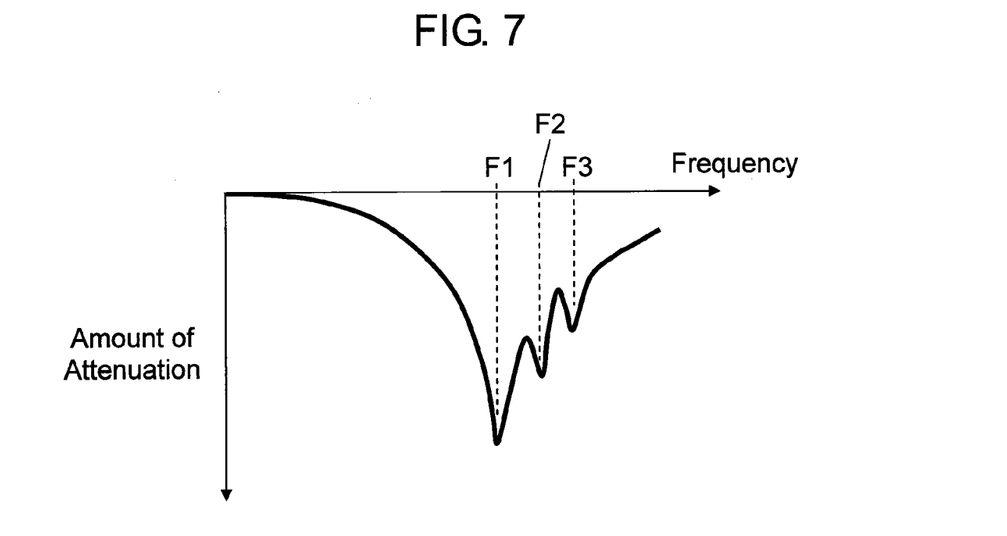
FIG. 7 is a characteristic graph showing a relationship between frequency and an amount of attenuation for the laminated electronic component according to the second embodiment of the invention.

FIG. 7 is a characteristic graph showing a relationship between frequency and an amount of attenuation for the laminated electronic component according to the second embodiment of the invention. In FIG. 7, two resonance frequencies (F2 and F3) appear due to floating capacitance components and inductance components of second coil patterns 6, resulting in the generation of attenuation poles at three frequencies (F1, F2, and F3). This allows noise rejection in a broad frequency band or at a plurality of frequencies.

Figure 8:
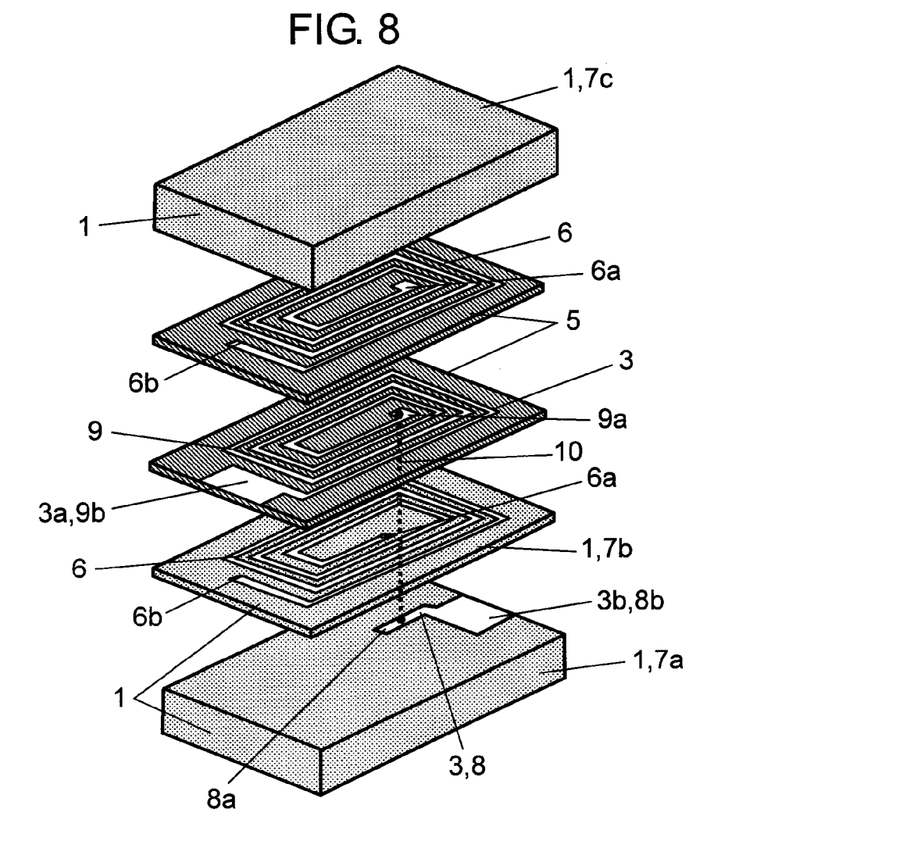
FIG. 8 is an exploded perspective view of another example of the laminated electronic component according to the second embodiment of the invention.

FIG. 8 is an exploded perspective view of another example of the laminated electronic component according to the second embodiment of the invention. In FIG. 8, two second coil patterns 6 are disposed so as to sandwich first coil pattern 3 therebetween. With this configuration, stable characteristics can be obtained.

It should be noted that, in the aforementioned second embodiment of the invention, although two of second coil pattern 6 are formed, three or more thereof may be formed. In such cases where three or more of second coil pattern 6 are formed, the number of attenuation poles will increase, thereby allowing noise rejection in a broader frequency band or at a larger number of frequencies.

Third Embodiment

Figure 9:
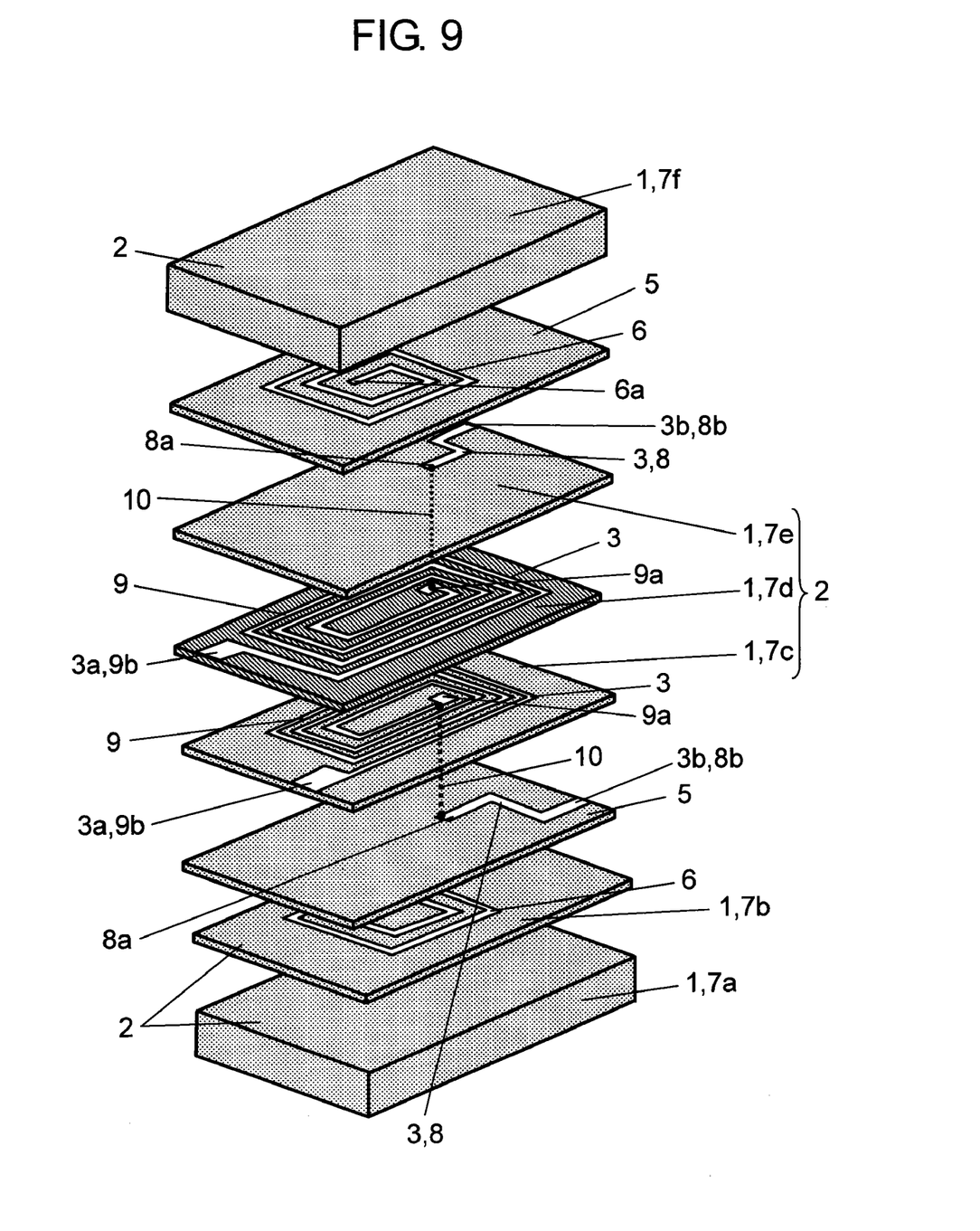
FIG. 9 is an exploded perspective view of a laminated electronic component according to a third embodiment of the invention.
Figure 10:
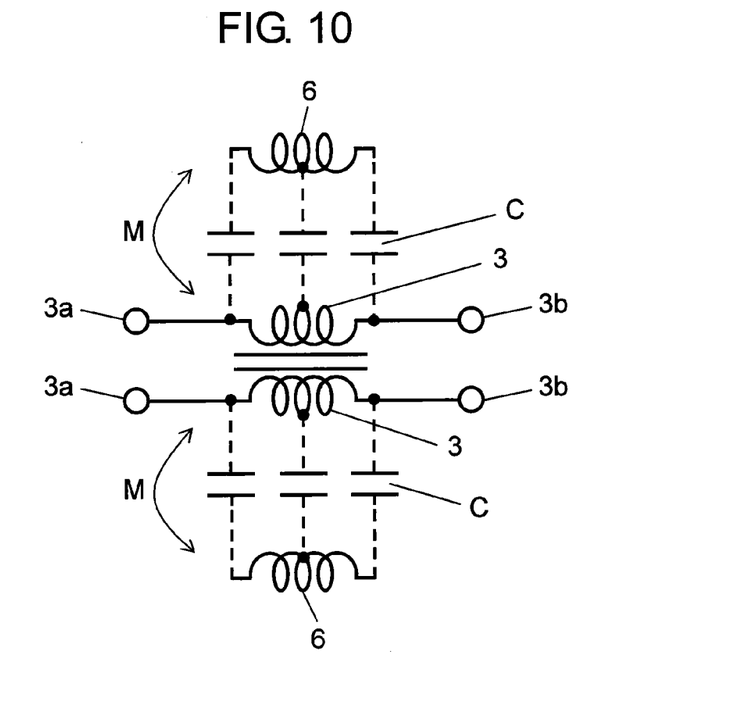
FIG. 10 is an equivalent circuit schematic of the laminated electronic component according to the third embodiment of the invention.

FIG. 9 is an exploded perspective view of a laminated electronic component according to a third embodiment of the invention. FIG. 10 is an equivalent circuit schematic of the laminated electronic component according to the third embodiment of the invention. Note that, in the third embodiment of the invention, parts having similar configurations to those of the aforementioned first embodiment of the invention are designated with the same reference numerals, and their explanations are omitted.

In FIGS. 9 and 10, a difference of the third embodiment of the invention from the aforementioned first embodiment of the invention is in that two of first coil pattern 3 are disposed, and a common-mode noise filter is provided through the use of two first coil patterns 3. Second coil patterns 6 are formed so as to correspond to first coil patterns 3. And, respective spirally-coiled conductors 9 of first coil patterns 3 are configured so as to face one another such that coiled conductors 9 are magnetically coupled with one another. Thus, common-mode noise is rejected.

Figure 11:
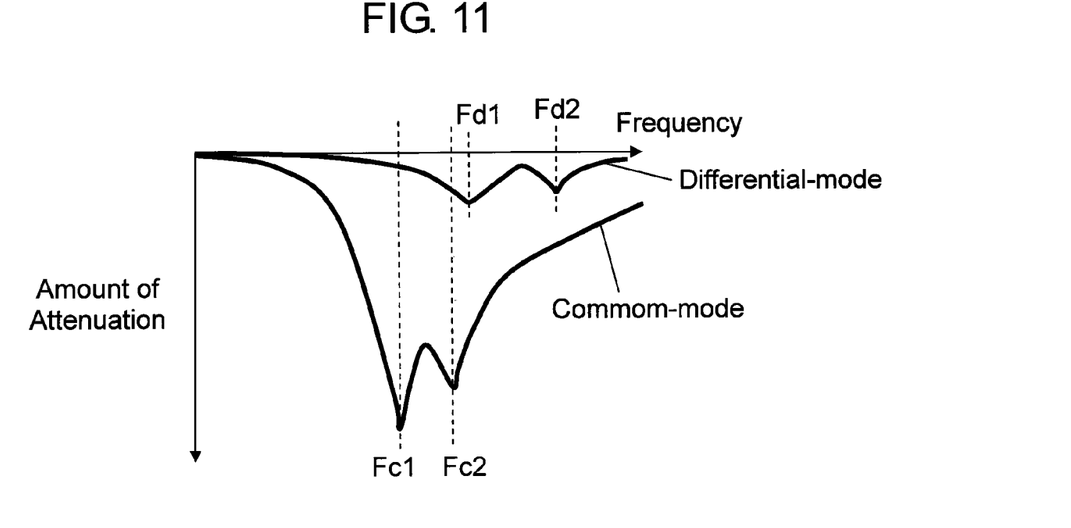
FIG. 11 is a characteristic graph showing a relationship between frequency and an amount of attenuation for the laminated electronic component according to the third embodiment of the invention.

FIG. 11 is a characteristic graph showing a relationship between frequency and an amount of attenuation for the laminated electronic component according to the third embodiment of the invention. In FIG. 11, attenuation poles are generated at two frequencies (Fc1 and Fc2) in the common-mode filter as well. Consequently, common-mode noise can be rejected in a broad frequency band or at two frequencies. Note that, for differential-mode (normal-mode), attenuation poles are generated at two frequencies (Fd1 and Fd2) as well.

Figure 12:
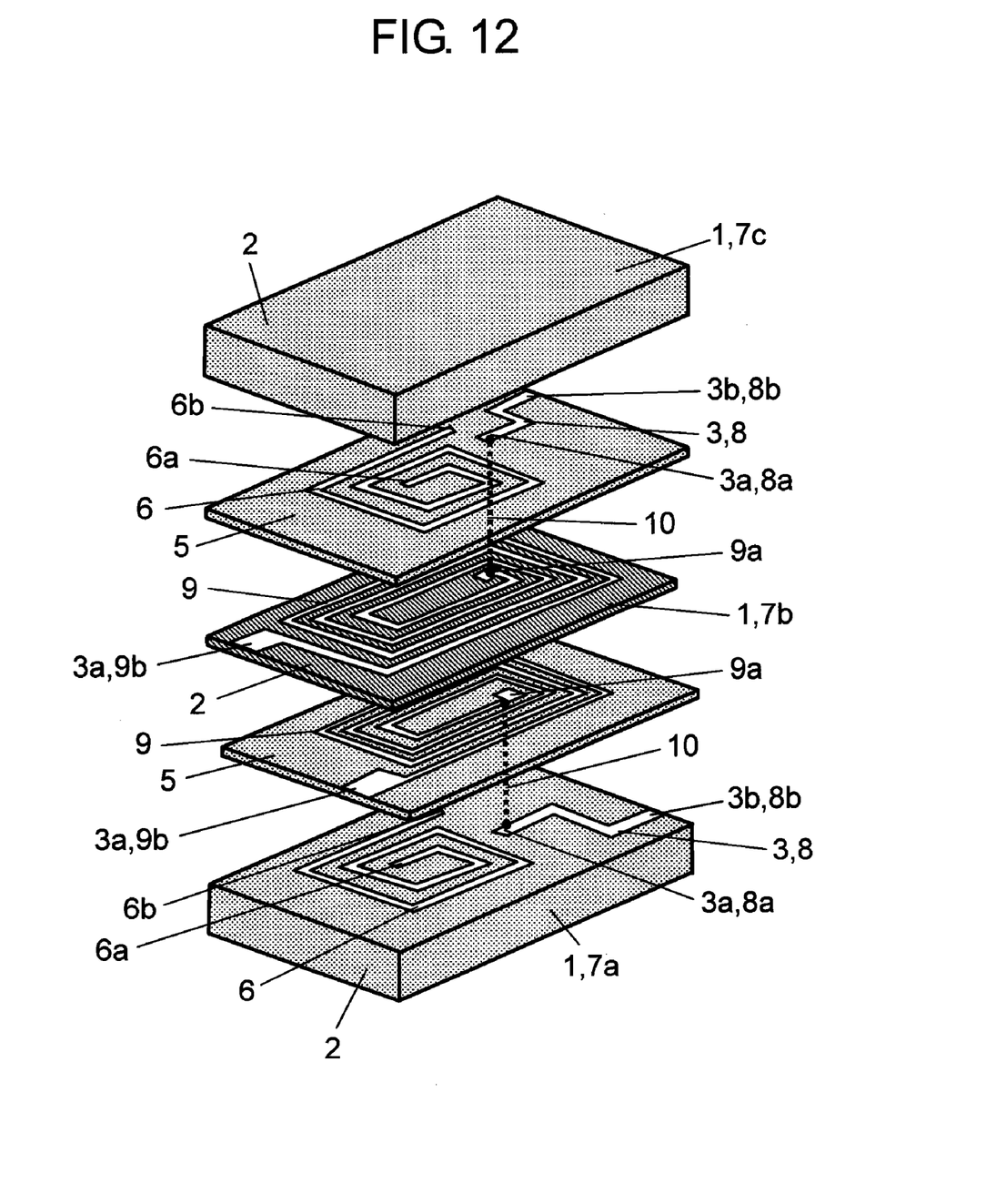
FIG. 12 is an exploded perspective view of another example of the laminated electronic component according to the third embodiment of the invention.

FIG. 12 is an exploded perspective view of another example of the laminated electronic component according to the third embodiment of the invention. In FIG. 12, since second coil patterns 6 and leading conductors 8 of first coil patterns 3 are disposed in the same respective insulating layers, it becomes possible to obtain the electronic component of a low profile.

INDUSTRIAL APPLICABILITY

Laminated electronic components according to the present invention are capable of rejecting noise in a broad frequency band or at a plurality of frequencies. In particular, the invention is useful in laminated electronic components for use, as a measure against noise, in a wide range of electronic equipment including digital devices, audiovisual devices, and information-communication terminal devices.

| DESCRIPTION OF REFERENCE MARKS | |
|---|---|
| 1 | first insulating layer |
| 3 | first coil pattern |
| 3a, 3b | both ends of first coil pattern |
| 4a, 4b | external electrode |
| 5 | second insulating layer |
| 6 | second coil pattern |
| 6a, 6b | both ends of second coil pattern |

The invention claimed is:

1. A laminated electronic component comprising:
a first coil pattern formed on upper surfaces of a plurality of first insulating layers, with both ends of the first coil pattern being coupled with external electrodes; and
a second coil pattern disposed so as to face the first coil pattern through at least one second insulating layer,
wherein portions, facing one another, of the first coil pattern and the second coil pattern are each of a spiral shape, and
wherein both ends of the second coil pattern are formed on the second insulating layer and the second insulating layer has no electrical connection point between any of the both ends and the external electrodes.

2. The laminated electronic component according to claim 1, wherein a plurality of the second coil patterns are disposed.

3. The laminated electronic component according to claim 1, wherein portions, facing one another, of the first coil pattern and the second coil pattern are disposed so as to be superposed on one another as viewed from above.

4. The laminated electronic component according to claim 1, wherein a portion of the insulating layers includes one of magnetic material and dielectric material.

5. The laminated electronic component according to claim 1, wherein two of the first coil pattern are disposed and the two first coil patterns configure a common-mode noise filter.

6. The laminated electronic component according to claim 5, wherein the second coil pattern and a leading conductor of the first coil patterns are disposed on identical respective ones of the insulating layers.

7. The laminated electronic component according to claim 1, wherein the second coil pattern is a single spiral pattern that is not exposed to an outside of the insulating layer.

* * * * *